United States Patent
Takei

(10) Patent No.: US 8,416,021 B2
(45) Date of Patent: Apr. 9, 2013

(54) AMPLIFIER CIRCUIT

(75) Inventor: Tatsuya Takei, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/221,310

(22) Filed: Aug. 30, 2011

(65) Prior Publication Data

US 2012/0049958 A1    Mar. 1, 2012

(30) Foreign Application Priority Data

Aug. 30, 2010  (JP) ................................ 2010-192653

(51) Int. Cl.
*H03F 3/45* (2006.01)

(52) U.S. Cl.
USPC ......................................... 330/258; 330/253

(58) Field of Classification Search .................. 330/253, 330/258, 261
See application file for complete search history.

(56) References Cited

U.S. PATENT DOCUMENTS

2010/0301939 A1* 12/2010 Lim .............................. 330/253
2011/0254626 A1* 10/2011 Harada .......................... 330/261

OTHER PUBLICATIONS

Refet Firsat Yazicioglu et al., "A 200 μW Eight-Channel EEG Acquisition ASIC for Ambulatory EEG Systems," IEEE Journal of Solid-State Circuits, vol. 43, No. Dec. 12, 2008, pp. 3025-3038.

* cited by examiner

*Primary Examiner* — Khanh V Nguyen
(74) *Attorney, Agent, or Firm* — Westerman, Hattori, Daniels & Adrian, LLP

(57) ABSTRACT

An amplifier circuit may include an input differential pair that includes a first transistor and a second transistor, a positive input voltage being supplied to a gate terminal of the first transistor, a negative input voltage being supplied to a gate terminal of the second transistor, a first resistor that generates a differential current corresponding to a differential voltage between the positive input voltage and the negative input voltage, an output differential pair that includes a third transistor and a fourth transistor, a negative output voltage being supplied from a drain terminal of the third terminal, a positive output voltage being supplied from a drain terminal of the fourth terminal, a second resistor that is connected to a reference voltage, the differential current generated by the first resistor being supplied to the second resistor, and a bias circuit that supplies a constant bias current to the first, second, third, and fourth transistors.

5 Claims, 3 Drawing Sheets

US 8,416,021 B2

AMPLIFIER CIRCUIT

BACKGROUND OF THE INVENTION

1. Field of the Invention

The present invention relates to an amplifier circuit that amplifies an input signal. More specifically, the present invention relates to an amplifier circuit wherein a common-mode rejection ratio is improved.

Priority is claimed on Japanese Patent Application No. 2010-192653, filed Aug. 30, 2010, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

An instrumentation amplifier is known as a method of precisely detecting the output signal of a sensor or the like. An instrumentation amplifier is expected to achieve three things: high input signal amplification rate, a high common-mode rejection ratio, and a high input impedance.

While, ideally, there is no limit on the common-mode rejection ratio, it is limited to a finite value by the offset voltage of the input differential pair of transistors that form the instrumentation amplifier. It is therefore essential to control the source-drain voltages of the input differential pair of transistors so that they are equal, since they affect the offset voltage. "A 200 uW Eight-Channel EEG Acquisition ASIC for Ambulatory EEG Systems" by Refet Firat Yazicioglu et al., IEEE Journal of Solid-State Circuits, Vol. 43, No. 12 Dec. 2008, pp. 3025-3038, which will be hereinafter referred to as "non-patent literature 1", discloses a method of controlling the source-drain voltages of an input differential pair of transistors so that they are equal.

FIG. 3 is a circuit diagram illustrating an instrumentation amplifier disclosed in non-patent literature 1. As shown in FIG. 3, an amplifier circuit 300 includes, as external connecting terminals, nine input/output terminals: a power voltage terminal VDD, a power voltage terminal VSS, a reference voltage terminal VCM, a bias voltage terminal BIAS1, a bias voltage terminal BIAS2, a positive input voltage terminal VINP, a negative input voltage terminal VINM, a positive output voltage terminal VOUTP, and a negative output voltage terminal VOUTM. The amplifier circuit 300 also includes a P-type transistor M1, a P-type transistor M2, a P-type transistor M5, a P-type transistor M6, a P-type transistor M7, a P-type transistor M10, a P-type transistor M11, a P-type transistor M12, a P-type transistor M17, a P-type transistor M18, a P-type transistor M19, a P-type transistor M20, a P-type transistor M21, a P-type transistor M22, an N-type transistor M3, an N-type transistor M4, an N-type transistor M8, an N-type transistor M9, an N-type transistor M13, an N-type transistor M14, an N-type transistor M15, an N-type transistor M16, a resistor R1, and a resistor R2. The P-type transistor M1 and the P-type transistor M2 constitute an input differential pair, and the N-type transistor M3 and the N-type transistor M4 constitute an output differential pair.

The source terminal of the P-type transistor M5 is connected to the power voltage terminal VDD, and the gate terminal is connected to the bias voltage terminal BIAS1. The source terminal of the P-type transistor M10 is connected to the power voltage terminal VDD, and the gate terminal is connected to the bias voltage terminal BIAS1.

The source terminal of the P-type transistor M1 is connected to the drain terminal of the P-type transistor M5, and the gate terminal is connected to the positive input voltage terminal VINP. The source terminal of the P-type transistor M2 is connected to the drain terminal of the P-type transistor M10, and the gate terminal is connected to the negative input voltage terminal VINM.

The resistor R1 is connected between the source terminal of the P-type transistor M1 and the source terminal of the P-type transistor M2. The drain terminal of the N-type transistor M3 is connected to the source terminal of the P-type transistor M1, the drain terminal of the P-type transistor M5, and one end of the resistor R1, and the source terminal supplies a negative output voltage (VOUTM). The drain terminal of the N-type transistor M4 is connected to the source terminal of the P-type transistor M2, the drain terminal of the P-type transistor M10, and the other end of the resistor R1, and the source terminal supplies a positive output voltage (VOUTP).

The resistor R2 is connected between the source terminal of the N-type transistor M3 and the source terminal of the N-type transistor M4, and the middle point is connected to the reference voltage terminal VCM. The drain terminal of the N-type transistor M15 is connected to the source terminal of the N-type transistor M3 and one end of the resistor R2, the gate terminal is connected to the bias voltage terminal BIAS2, and the source terminal is connected to the power voltage terminal VSS. The drain terminal of the N-type transistor M16 is connected to the source terminal of the N-type transistor M4 and the other end of the resistor R2, the gate terminal is connected to the bias voltage terminal BIAS2, and the source terminal is connected to the power voltage terminal VSS.

The source terminal of the P-type transistor M17 is connected to the power voltage terminal VDD, the gate terminal is connected to the bias voltage terminal BIAS1, and the drain terminal is connected to the gate terminal of the N-type transistor M3. The source terminal of the P-type transistor M20 is connected to the power voltage terminal VDD, the gate terminal is connected to the bias voltage terminal BIAS1, and the drain terminal is connected to the gate terminal of the N-type transistor M4.

The source terminal of the P-type transistor M18 is connected to the drain terminal of the P-type transistor M17 and the gate terminal of the N-type transistor M3, and the gate terminal is shorted to the drain terminal. The source terminal of the P-type transistor M21 is connected to the drain terminal of the P-type transistor M20 and the gate terminal of the N-type transistor M4, and the gate terminal is shorted to the drain terminal.

The source terminal of the P-type transistor M19 is connected to the drain terminal of the P-type transistor M18, and the drain terminal is connected to the power voltage terminal VSS. The source terminal of the P-type transistor M22 is connected to the drain terminal of the P-type transistor M21, and the drain terminal is connected to the power voltage terminal VSS.

The source terminal of the P-type transistor M7 is connected to the drain terminal of the P-type transistor M1, and the drain terminal is connected to the gate terminal of the P-type transistor M19. The source terminal of the P-type transistor M12 is connected to the drain terminal of the P-type transistor M2, and the drain terminal is connected to the gate terminal of the P-type transistor M22.

The drain terminal of the N-type transistor M9 is connected to the drain terminal of the P-type transistor M7 and the gate terminal of the P-type transistor M19, the gate terminal is connected to the bias voltage terminal BIAS2, and the source terminal is connected to the power voltage terminal VSS. The drain terminal of the N-type transistor M14 is connected to the drain terminal of the P-type transistor M12 and the gate terminal of the P-type transistor M22, the gate terminal is connected to the bias voltage terminal BIAS2, and the source terminal is connected to the power voltage terminal VSS.

The source terminal of the P-type transistor M6 is connected to the source terminal of the P-type transistor M1, and the gate and drain terminals are connected to the gate terminal of the P-type transistor M7. The source terminal of the P-type transistor M11 is connected to the source terminal of the P-type transistor M2, and the gate and drain terminals are connected to the gate terminal of the P-type transistor M12.

The drain terminal of the N-type transistor M8 is connected to the drain terminal of the P-type transistor M6, the gate terminal is connected to the bias voltage terminal BIAS2, and the source terminal is connected to the power voltage terminal VSS. The drain terminal of the N-type transistor M13 is connected to the drain terminal of the P-type transistor M11, the gate terminal is connected to the bias voltage terminal BIAS2, and the source terminal is connected to the power voltage terminal VSS.

The resistor R2 includes a resistor R3 and a resistor R4 which have equal resistance values. The resistor R3 is connected between the drain terminal of the N-type transistor M3 and the reference voltage terminal VCM, and the resistor R4 is connected between the drain terminal of the N-type transistor M4 and the reference voltage terminal VCM.

The P-type transistor M5, the P-type transistor M10, the P-type transistor M17, the P-type transistor M20, the N-type transistor M8, the N-type transistor M9, the N-type transistor M13, the N-type transistor M14, the N-type transistor M15, and the N-type transistor M16 control the currents flowing through them to be a constant value.

Based on the bias voltage (BIAS1), the P-type transistor M5 controls the sum of the bias currents supplied to the P-type transistor M1, the N-type transistor M3, and the P-type transistor M6 to be a constant value. Based on the bias voltage (BIAS1), the P-type transistor M10 controls the sum of the bias currents supplied to the P-type transistor M2, the N-type transistor M4, and the P-type transistor M11 to be a constant value.

Based on the bias voltage (BIAS1), the P-type transistor M17 controls the bias current supplied to the P-type transistor M18 to be a constant value. Based on the bias voltage (BIAS1), the P-type transistor M20 controls the bias current supplied to the P-type transistor M21 to be a constant value.

Based on the bias voltage (BIAS2), the N-type transistor M8 controls the bias current supplied to the P-type transistor M6 to be a constant value. Based on the bias voltage (BIAS2), the N-type transistor M9 controls the bias current supplied to the P-type transistor M7 to be a constant value.

Based on the bias voltage (BIAS2), the N-type transistor M13 controls the bias current supplied to the P-type transistor M11 to be a constant value. Based on the bias voltage (BIAS2), the N-type transistor M14 controls the bias current supplied to the P-type transistor. M12 to be a constant value.

Based on the bias voltage (BIAS2), the N-type transistor M15 controls the bias current supplied to the N-type transistor M3 to be a constant value. Based on the bias voltage (BIAS2), the N-type transistor M16 controls the bias current supplied to the N-type transistor M4 to be a constant value. For sake of simplicity, polarities will not be designated in the explanation below.

The operation of the amplifier circuit 300 will be described. In the amplifier circuit 300, when a positive input voltage (VINP) is input to the gate terminal of the transistor M1, and a negative input voltage (VINM) is supplied to the gate terminal of the transistor M2, the differential voltage ($\Delta$vin) of the positive input voltage (VINP) and the negative input voltage (VINM) is generated in the resistor R1. The resistor R1 generates a differential current ($\Delta i=\Delta vin/r1$) corresponding to the differential voltage ($\Delta$vin) and the resistance value (r1) of the resistor R1. This differential current ($\Delta i$) generated by the resistor R1 changes the current (i3) flowing to the transistor M3 and the current (i4) flowing to the transistor M4. If the current (i15) flowing to the transistor M15 and the current (i16) flowing to the transistor M16 are in a steady state of (i=i15=i16), the relationship between the differential current ($\Delta i$) and the current flowing (i1) to the transistor M1 and the current (i2) flowing to the transistor M2 is expressed in equations (1) to (3).

If a positive input voltage (VINP)>a negative input voltage (VINM), then $$i3=i-\Delta i, i4=i+\Delta i, \Delta i \neq 0 \qquad (1).$$

If a positive input voltage (VINP)<a negative input voltage (VINM), then $$i3=i+\Delta i, i4=i-\Delta i, \Delta i \neq 0 \qquad (2).$$

If a positive input voltage (VINP)=a negative input voltage (VINM), then $$i3=i, i4=i, \Delta i=0 \qquad (3).$$

Since the current (i5) flowing to the transistor M5, the current (i10) flowing to the transistor M10, the current (i17) flowing to the transistor M17, and the current (i20) flowing to the transistor M20 are controlled by the bias voltage (BIAS1), and the current (i8) flowing to the transistor M8, the current (i9) flowing to the transistor M9, the current (i13) flowing to the transistor M13, the current (i14) flowing to the transistor M14, the current (i15) flowing to the transistor M15, and the current (i16) flowing to the transistor M16 are controlled by the bias voltage (BIAS2), these currents are not affected by the value of the differential voltage ($\Delta$vin). Therefore, the current generated in the resistor R2 is the same as the current ($\Delta i$) generated in the resistor R1. The relationship between the differential voltage ($\Delta$vout) of the positive output voltage (VOUTP) and the negative output voltage (VOUTM) and the differential voltage ($\Delta$vin) of the positive input voltage (VINP) and the negative input voltage (VINM) is expressed using the resistance value (r1) of the resistor R1, the resistance value (r2) of resistor R2, the resistance value (r3) of resistor R3, and the resistance value (r4) of resistor R4 in equations (4) and (5).

If a positive input voltage (VINP)>a negative input voltage (VINM), then $$\begin{aligned} voutp &= vcm + \Delta i \times r4 \\ &= vcm + \frac{r4}{r1} \Delta vin \\ &= vcm + \frac{r2}{2 \times r1} \Delta vin \end{aligned} \qquad (4)$$

$$\begin{aligned} voutm &= vcm - \Delta i \times r3 \\ &= vcm - \frac{r3}{r1} \Delta vin \\ &= vcm - \frac{r2}{2 \times r1} \Delta vin \end{aligned}$$

-continued $$\Delta vout = voutp - voutm$$
$$= vcm + \frac{r2}{2 \times r1}\Delta vin - vcm + \frac{r2}{2 \times r1}\Delta vin$$
$$= \frac{r2}{r1}\Delta vin$$

If a positive input voltage (VINP)<a negative input voltage (VINM), then $$voutp = vcm - \Delta i \times r4 \quad (5)$$
$$= vcm - \frac{r4}{r1}\Delta vin$$
$$= vcm - \frac{r2}{2 \times r1}\Delta vin$$

$$voutm = vcm + \Delta i \times r3$$
$$= vcm + \frac{r3}{r1}\Delta vin$$
$$= vcm + \frac{r2}{2 \times r1}\Delta vin$$

$$\Delta vout = voutp - voutm$$
$$= vcm - \frac{r2}{2 \times r1}\Delta vin - vcm - \frac{r2}{2 \times r1}\Delta vin$$
$$= -\frac{r2}{r1}\Delta vin$$

The amplifier circuit 300 amplifies the differential voltage ($\Delta$vin) of the positive input voltage (VINP) and the negative input voltage (VINM) corresponding to the ratio of the resistor R1 to the resistor R2 constituted by the resistor R3 and the resistor R4.

The operation of the current conveyor circuit 301 will be described. The current conveyor circuit 301 includes four transistors: a transistor M6, a transistor M7, a transistor M8 and a transistor M9. If "vds1" is the drain-source voltage of the transistor M1, "vs1" is the source voltage of the transistor M1, "vd1" is the drain voltage of the transistor M1, "vgs1" is the gate-source voltage of the transistor M1, "vgs7" is the gate-source voltage of the transistor M7, and "vgs6" is the gate-source voltage of the transistor M6, then the drain-source voltage (vds1) of the transistor M1 is expressed by equation (6).

$$vds1 = vs1 - vd1 = vinp + vgs1 - (vinp + vgs1 - vgs6 + vgs7)$$
$$= vgs6 - vgs7 \quad (6)$$

Therefore, regardless of the value of the positive input voltage (VINP), the drain-source voltage (vds1) of the transistor M1 is fixed at the value expressed by a subtraction of the gate-source voltage (vgs6) of the transistor M6 and the gate-source voltage (vgs7) of the transistor M7. That is, the current conveyor circuit 301 has a function of keeping the drain-source voltage (vds1) of the transistor M1 constant.

The operation of the current conveyor circuit 302 will be described. The current conveyor circuit 302 includes four transistors: a transistor M11, a transistor M12, a transistor M13 and a transistor M14. If (vds2) is the drain-source voltage of the transistor M2, (vd2) is the drain voltage of the transistor M2, (vgs2) is the gate-source voltage of the transistor M2, (vgs12) is the gate-source voltage of the transistor M12, and (vgs11) is the gate-source voltage of the transistor M11, the drain-source voltage (vds2) of the transistor M2 is expressed by equation (7).

$$vds2 = vs2 - vd2 = vinm + vgs2 - (vinm + vgs2 - vgs11 + vgs12) = vgs11 - vgs12 \quad (7)$$

Therefore, regardless of the value of the negative input voltage (VINM), the drain-source voltage (vds2) of the transistor M2 is fixed at a value expressed by a subtraction of the gate-source voltage (vgs11) of the transistor M11 and the gate-source voltage (vgs12) of the transistor M12. That is, the current conveyor circuit 302 has a function of keeping the drain-source voltage (vds2) of the transistor M1 constant.

As described above, the circuit described in non-patent literature 1 reduces the offset created by using the current conveyor circuit 301 and the current conveyor circuit 302 to ensure that the drain-source voltage (Vds1) of the transistor M1 and the drain-source voltage (vds2) of the transistor M2 are constant, and thereby improves the common-mode rejection ratio.

Since the amplifier circuit 300 requires the current conveyor circuit 301 and the current conveyor circuit 302 in order to improve the common-mode rejection ratio, the size of the circuit increases, as does the current consumption.

SUMMARY

The present invention provides an amplifier circuit wherein current consumption and circuit size can be reduced while increasing the common-mode rejection ratio.

An amplifier circuit may include an input differential pair that includes a first transistor and a second transistor, a positive input voltage being supplied to a gate terminal of the first transistor, a negative input voltage being supplied to a gate terminal of the second transistor, a first resistor that generates a differential current corresponding to a differential voltage between the positive input voltage and the negative input voltage, an output differential pair that includes a third transistor and a fourth transistor, a negative output voltage being supplied from a drain terminal of the third terminal, a positive output voltage being supplied from a drain terminal of the fourth terminal, a second resistor that is connected to a reference voltage, the differential current generated by the first resistor being supplied to the second resistor, and a bias circuit that supplies a constant bias current to the first, second, third, and fourth transistors. A source terminal of the first transistor may be connected to a gate terminal of the third transistor. A source terminal of the second transistor may be connected to a gate terminal of the fourth transistor. A drain terminal of the first transistor may be connected to a source terminal of the third transistor. A drain terminal of the second transistor may be connected to a source terminal of the fourth transistor. The input differential pair and the output differential pair may include transistors having reversed polarities.

The first resistor maybe connected between a source terminal of the first transistor and a source terminal of the second transistor. The second resistor may be connected between a drain terminal of the third transistor and a drain terminal of the fourth transistor.

The first resistor may be connected between a drain terminal of the first transistor and a drain terminal of the second transistor. The second resistor may be connected between a drain terminal of the third transistor and a drain terminal of the fourth transistor.

The bias circuit may include a fifth transistor that supplies a constant bias current to the first transistor, a sixth transistor that supplies a constant bias current to the second transistor, a seventh transistor that supplies a constant bias current to the third transistor, an eighth transistor that supplies a constant bias current to the fourth transistor, a ninth transistor that controls sum of currents supplied to the first transistor and the third transistor to be a constant value, and a tenth transistor that controls sum of currents supplied to the second transistor and the fourth transistor to be a constant value.

The second resistor may include a third resistor and a fourth resistor having same resistance values. The first resistor, the third resistor, and the fourth resistor may be of a same type.

According to the present invention, in respect of a first transistor and a second transistor constituting an input differential pair, and a third transistor and a fourth transistor constituting an output differential pair, the source terminal of the first transistor is connected to the gate terminal of the third transistor, the source terminal of the second transistor is connected to the gate terminal of the fourth transistor, the drain terminal of the first transistor is connected to the source terminal of the third transistor, the drain terminal of the second transistor is connected to the source terminal of the fourth transistor, and the input differential pair and the output differential pair include transistors having reversed polarities. This configuration can reduce power consumption and the circuit size while improving and increasing the common-mode rejection ratio.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teaching of the present invention and that the present invention is not limited to the embodiments illustrated for explanatory purpose.

First Preferred Embodiment

Figure 1:
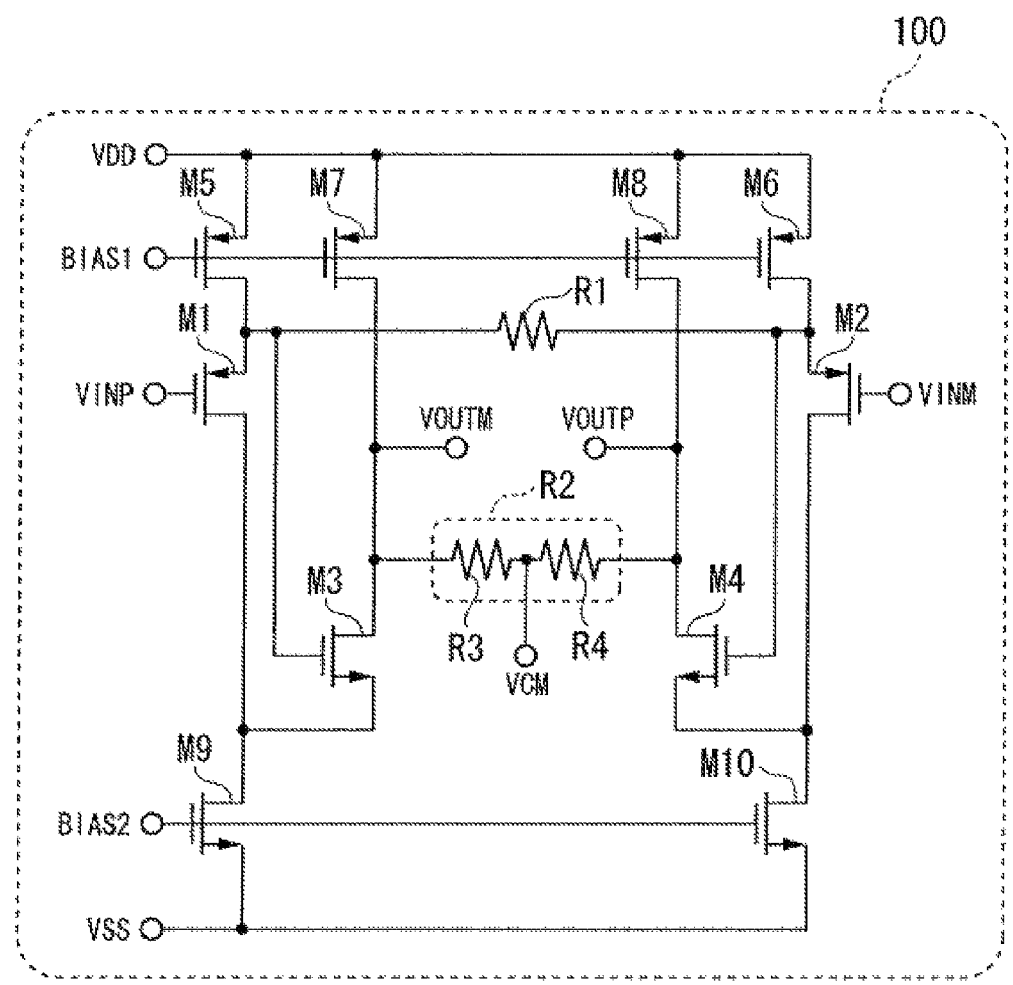
FIG. 1 is a circuit diagram illustrating an amplifier circuit in accordance with a first preferred embodiment of the present invention.

A first preferred embodiment of the present invention will be described. FIG. 1 is a circuit diagram illustrating an amplifier circuit in accordance with the first preferred embodiment of the present invention. An amplifier circuit 100 shown in FIG. 1 includes, as external connecting terminals, nine input/output terminals: a power voltage terminal VDD, a power voltage terminal VSS, a reference voltage terminal VCM, a bias voltage terminal BIAS1, a bias voltage terminal BIAS2, a positive input voltage terminal VINP, a negative input voltage terminal VINM, a positive output voltage terminal VOUTP, a negative output voltage terminal VOUTM. The amplifier circuit 100 also includes a P-type transistor M1, a P-type transistor M2, a P-type transistor M5, a P-type transistor M6, a P-type transistor M7, a P-type transistor M8, an N-type transistor M3, an N-type transistor M4, an N-type transistor M9, an N-type transistor M10, a resistor R1, and a resistor R2. The P-type transistor M1 and the P-type transistor M2 constitute an input differential pair, and the N-type transistor M3 and the N-type transistor M4 constitute an output differential pair.

The source terminal of the P-type transistor M5 is connected to the power voltage terminal VDD, and the gate terminal is connected to the bias voltage terminal BIAS1. The source terminal of the P-type transistor M6 is connected to the power voltage terminal VDD, and the gate terminal is connected to the bias voltage terminal BIAS1.

The source terminal of the P-type transistor M1 is connected to the drain terminal of the P-type transistor M5, and the gate terminal is connected to the positive input voltage terminal VINP. The source terminal of the P-type transistor M2 is connected to the drain terminal of the P-type transistor M6, and the gate terminal is connected to the negative input voltage terminal VINM.

The resistor R1 is connected between the source terminal of the P-type transistor M1 and the source terminal of the P-type transistor M2. The gate terminal of the N-type transistor M3 is connected to the source terminal of the P-type transistor M1, the drain terminal of the P-type transistor M5, and one end of the resistor R1, and a negative output voltage (VOUTM) is supplied from the drain terminal. The gate terminal of the N-type transistor M4 is connected to the source terminal of the P-type transistor M2, the drain terminal of the P-type transistor M6, and the other end of the resistor R1, and a positive output voltage (VOUTP) is supplied from the source terminal.

The resistor R2 is connected between the drain terminal of the N-type transistor M3 and the drain terminal of the N-type transistor M4, and the middle point is connected to the reference voltage terminal VCM. The drain terminal of the N-type transistor M9 is connected to the drain terminal of the P-type transistor M1 and the source terminal of the N-type transistor M3, the gate terminal is connected to the bias voltage terminal BIAS2, and the source terminal is connected to the power voltage terminal VSS. The drain terminal of the N-type transistor M10 is connected to the drain terminal of the P-type transistor M2 and the source terminal of the N-type transistor M4, the gate terminal is connected to the bias voltage terminal BIAS2, and the source terminal is connected to the power voltage terminal VSS.

The drain terminal of the P-type transistor M7 is connected to drain terminal of the N-type transistor M3 and one end of the resistor R2, the gate terminal is connected to the bias voltage terminal BIAS1, and the source terminal is connected to the power voltage terminal VDD. The drain terminal of the P-type transistor M8 is connected to drain terminal of the N-type transistor M4 and the other end of the resistor R2, the gate terminal is connected to the bias voltage terminal BIAS1, and the source terminal is connected to the power voltage terminal VDD.

The resistor R2 includes a resistor R3 and a resistor R4 which have equal resistance values. The resistor R3 is connected between the drain terminal of the N-type transistor M3 and the reference voltage terminal VCM. The resistor R4 is connected between the drain terminal of the N-type transistor M4 and the reference voltage terminal VCM.

The P-type transistor M5, the P-type transistor M6, the P-type transistor M7, the P-type transistor M8, the N-type transistor M9, and the N-type transistor M10 control the currents flowing through them to be a constant value.

Based on the bias voltage (BIAS1), the P-type transistor M5 controls the bias current supplied to the P-type transistor M1 to be a constant value. Based on the bias voltage (BIAS1), the P-type transistor M6 controls the bias current supplied to the P-type transistor M2 to be a constant value.

Based on the bias voltage (BIAS2), the P-type transistor M7 controls the bias current supplied to the N-type transistor M3 to be a constant value. Based on the bias voltage (BIAS2), the P-type transistor M8 controls the bias current supplied to the N-type transistor M4 to be a constant value.

Based on the bias voltage (BIAS2), the N-type transistor M9 controls the sum of the bias currents supplied to the P-type transistor M1 and the N-type transistor M3 to be a constant value. Based on the bias voltage (BIAS2), the N-type transistor M10 controls the sum of the bias currents supplied to the P-type transistor M2 and the N-type transistor M4 to be a constant value.

The above connection designations are those when the power voltage (VDD) is the positive power and the power voltage (VSS) is the negative power. If the power voltage (VDD) is the negative power and the power voltage (VSS) is the positive power, the polarities of all the transistors are reversed. For sake of simplicity, polarities will not be designated in the explanation below.

The operation of the amplifier circuit 100 will be described. When a positive input voltage (VINP) is input to the gate terminal of the transistor M1, and a negative input voltage (VINM) is supplied to the gate terminal of the transistor M2, the differential voltage (Δvin) of the positive input voltage (VINP) and the negative input voltage (VINM) is generated in the resistor R1. The resistor R1 generates a differential current (Δi=Δvin/r1) corresponding to the differential voltage (Δvin) and the resistance value (r1) of the resistor R1. This differential current (Δi) generated by the resistor R1 changes the current (i1) flowing to the transistor M1 and the current (i2) flowing to the transistor M2. If the current (i5) flowing to the transistor M5 and the current (i6) flowing to the transistor M6 are in a steady state of (i=i5=i6), the relationship between the differential current (Δi) and the current flowing (i1) to the transistor M1 and the current (i2) flowing to the transistor M2 is expressed in equations (8) to (10).

If a positive input voltage (VINP)>a negative input voltage (VINM), then $$i1 = i - \Delta i,\ i2 = i + \Delta i,\ \Delta i \neq 0 \tag{8}$$

If a positive input voltage (VINP)<a negative input voltage (VINM), then $$i1 = i + \Delta i,\ i2 = i - \Delta i,\ \Delta i \neq 0 \tag{9}$$

If a positive input voltage (VINP)=a negative input voltage (VINM), then $$i1 = i,\ i2 = i,\ \Delta i = 0 \tag{10}$$

Since the current (i5) flowing to the transistor M5 and the current (i6) flowing to the transistor M6 are controlled by the bias voltage (BIAS1), the current (i7) flowing to the transistor M7 and the current (i8) flowing to the transistor M8 are controlled by the bias voltage (BIAS1), and the current (i9) flowing to the transistor M9 and the current (i10) flowing to the transistor M are controlled by the bias voltage (BIAS2), these currents are not affected by the value of the differential voltage (Δvin). Therefore, the resistor R2 generates the same current as the current (Δi) generated in the resistor R1. Therefore, relationship between differential voltage (Δvout) of the positive output voltage (VOUTP) and the negative output voltage (VOUTM) and the differential voltage (Δvin) of the positive input voltage (VINP) and the negative input voltage (VINM) is expressed using the resistance value (r1) of the resistor R1, the resistance value (r2) of resistor R2, the resistance value (r3) of resistor R3, and the resistance value (r4) of resistor R4 in equations (11) and (12).

If a positive input voltage (VINP)>a negative input voltage (VINM), then $$\begin{aligned}
voutp &= vcm + \Delta i \times r4 \\
&= vcm + \frac{r4}{r1}\Delta vin \\
&= vcm + \frac{r2}{2 \times r1}\Delta vin \\
voutm &= vcm - \Delta i \times r3 \\
&= vcm - \frac{r3}{r1}\Delta vin \\
&= vcm - \frac{r2}{2 \times r1}\Delta vin \\
\Delta vout &= voutp - voutm \\
&= vcm + \frac{r2}{2 \times r1}\Delta vin - vcm + \frac{r2}{2 \times r1}\Delta vin \\
&= \frac{r2}{r1}\Delta vin
\end{aligned} \tag{11}$$

If a positive input voltage (VINP)<a negative input voltage (VINM), then $$\begin{aligned}
voutp &= vcm - \Delta i \times r4 \\
&= vcm - \frac{r4}{r1}\Delta vin \\
&= vcm - \frac{r2}{2 \times r1}\Delta vin \\
voutm &= vcm + \Delta i \times r3 \\
&= vcm + \frac{r3}{r1}\Delta vin \\
&= vcm + \frac{r2}{2 \times r1}\Delta vin \\
\Delta vout &= voutp - voutm \\
&= vcm - \frac{r2}{2 \times r1}\Delta vin - vcm - \frac{r2}{2 \times r1}\Delta vin \\
&= -\frac{r2}{r1}\Delta vin
\end{aligned} \tag{12}$$

The amplifier circuit 100 amplifies the differential voltage (Δvin) of the positive input voltage (VINP) and the negative input voltage (VINM) corresponding to the ratio of the resistor R1 to the resistor R2 constituted by the resistor R3 and the resistor R4. The amplification precision can be increased by giving the resistor R1 the same type of configuration as the resistor R2 constituted by the resistor R3 and the resistor R4.

The drain-source voltage (vds1) of the transistor M1 will be described. If the drain-source voltage (vds1) of the transistor M1 is (vds1), the source voltage of the transistor M1 is (vs1), the drain voltage of the transistor M1 is (vd1), the gate-source voltage of the transistor M1 is (vgs1), and the gate-source voltage of the transistor M3 is (vgs3), the drain-source voltage (vds1) of the transistor M1 is expressed by equation (13).

$$vds1 = vs1 - vd1 = vinp + vgs1 - (vinp + vgs1 - vgs3) = vgs3 \tag{13}$$

Therefore, regardless of the value of the positive input voltage (VINP), the drain-source voltage (vds1) of the transistor M1 is fixed at the value of the gate-source voltage of the transistor M3 (vgs3).

The drain-source voltage (vds2) of the transistor M2 will be described. If the drain-source voltage (vds2) of the transistor M2 is (vds2), the source voltage of the transistor M2 is (vs2), the drain voltage of the transistor M2 is (vd2), the gate-source voltage of the transistor M2 is (vgs2), and the gate-source voltage of the transistor M4 is (vgs4), the drain-source voltage (vds2) of the transistor M2 is expressed by equation (14).

$$vds2=vs2-vd2=vinm+vgs2-(vinm+vgs2-vgs4)=vgs4 \quad (14)$$

Regardless of the values of the positive input voltage (VINP) and the negative input voltage (VINM), the drain-source voltage (vds1) of the transistor M1 and the drain-source voltage (vds2) of the transistor M2 can be kept at constant values, without using the current conveyor circuit of the related art. The drain-source voltage (vds1) of the transistor M1 and the drain-source voltage (vds2) of the transistor M2 can thus be kept at a constant value, without using the current conveyor circuit disclosed in the related art. This reduces the offset voltage in the transistors M1 and M2, and improves the common-mode rejection ratio of the amplifier circuit 100.

As described above, according to the circuit configuration of the first preferred embodiment of the present invention, in comparison with the circuit shown in non-patent literature 1, the common-mode rejection ratio can be improved with a smaller circuit and less power consumption.

Second Preferred Embodiment

Figure 2:
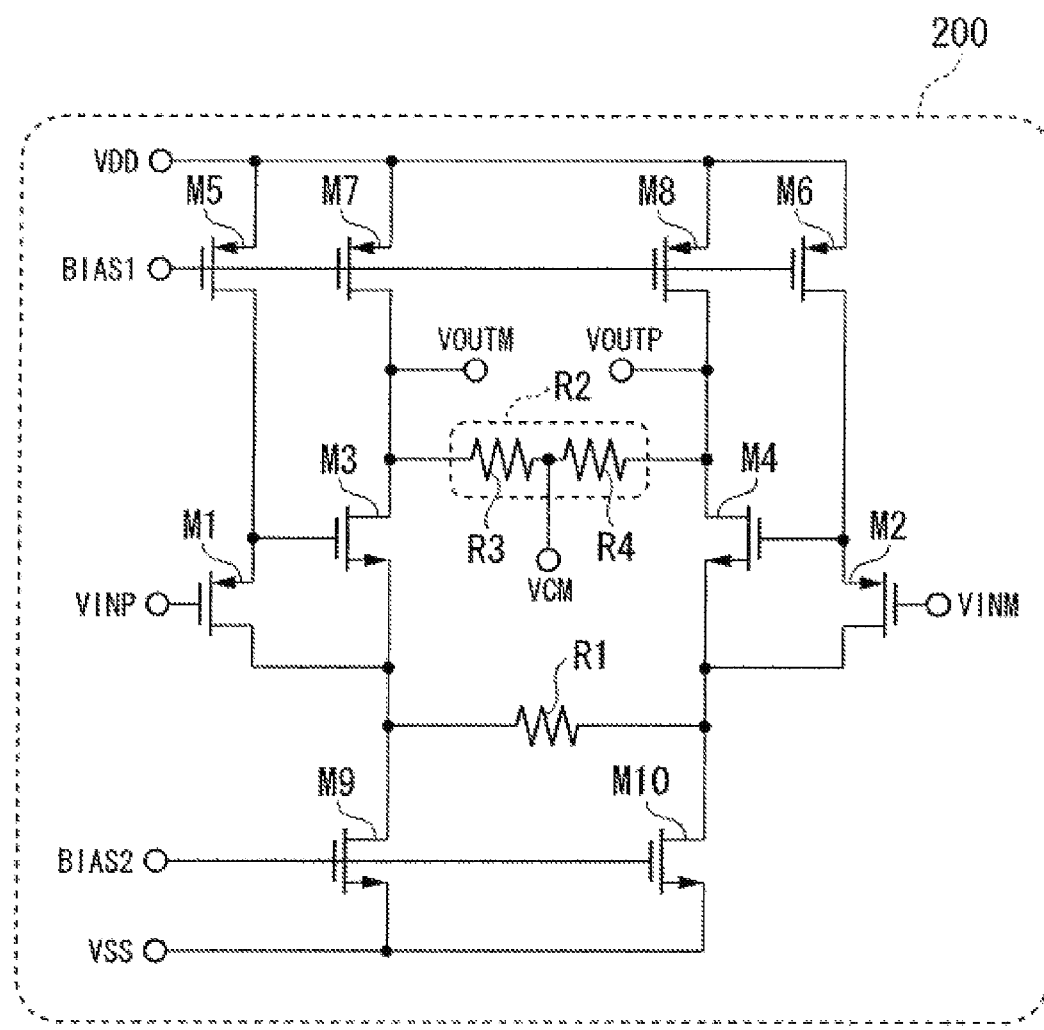
FIG. 2 is a circuit diagram illustrating an amplifier circuit in accordance with a second preferred embodiment of the present invention.
Figure 3:
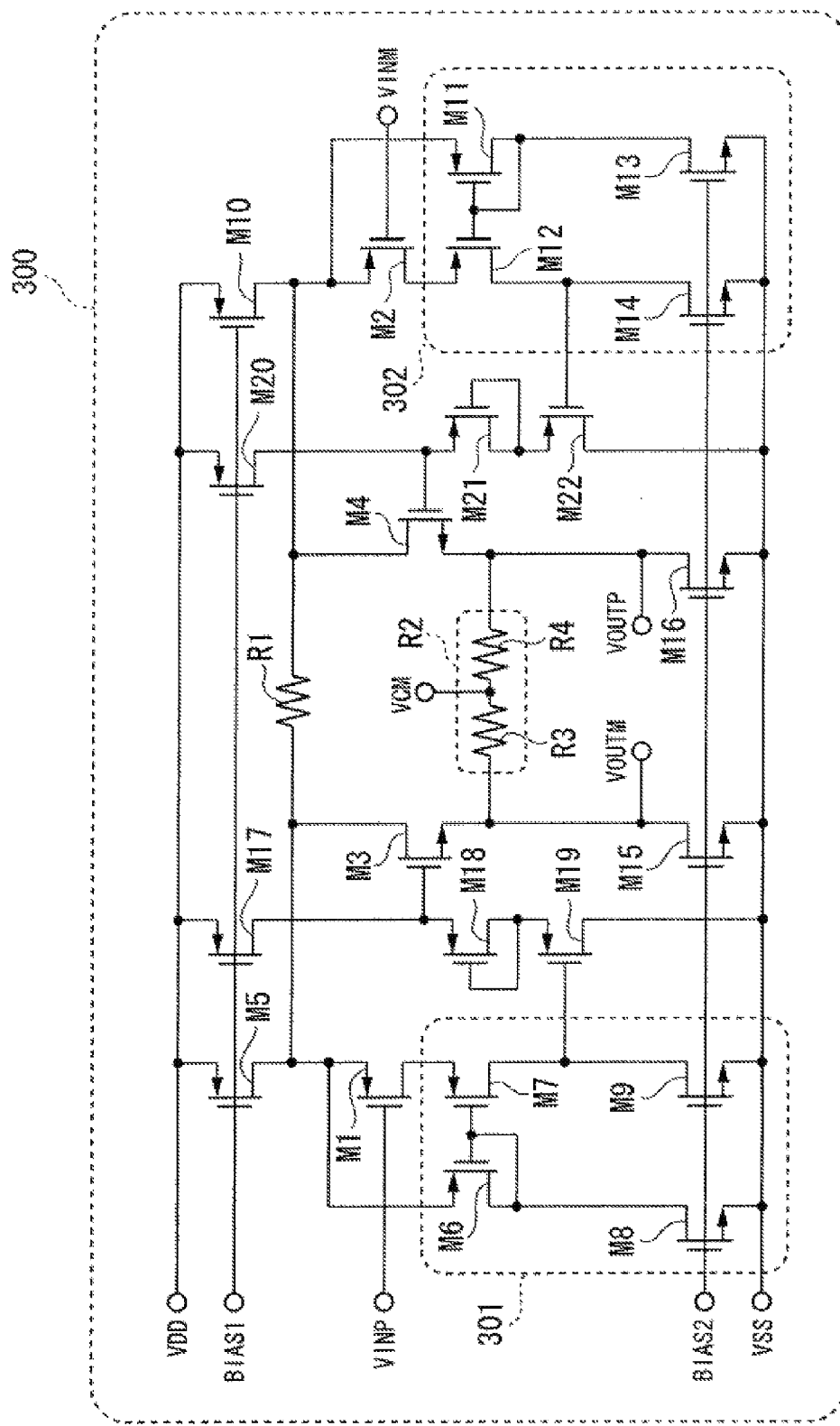
FIG. 3 is a circuit diagram illustrating an instrumentation amplifier in accordance with the related art.

A second preferred embodiment of the present invention will be described. FIG. 2 is a circuit diagram illustrating an amplifier circuit in accordance with the second preferred embodiment of the present invention. An amplifier circuit 200 shown in FIG. 2 includes, as external connecting terminals, nine input/output terminals: a power voltage terminal VDD, a power voltage terminal VSS, a reference voltage terminal VCM, a bias voltage terminal BIAS1, a bias voltage terminal BIAS2, a positive input voltage terminal VINP, a negative input voltage terminal VINM, a positive output voltage terminal VOUTP, a negative output voltage terminal VOUTM. The amplifier circuit 200 also includes a P-type transistor M1, a P-type transistor M2, a P-type transistor M5, a P-type transistor M6, a P-type transistor M7, a P-type transistor M8, an N-type transistor M3, an N-type transistor M4, an N-type transistor M9, an N-type transistor M10, a resistor R1, and a resistor R2. The P-type transistor M1 and the P-type transistor M2 constitute an input differential pair, and the N-type transistor M3 and the N-type transistor M4 constitute an output differential pair.

The source terminal of the P-type transistor M5 is connected to the power voltage terminal VDD, and the gate terminal is connected to the bias voltage terminal BIAS1. The source terminal of the P-type transistor M6 is connected to the power voltage terminal VDD, and the gate terminal is connected to the bias voltage terminal BIAS1.

The source terminal of the P-type transistor M1 is connected to the drain terminal of the P-type transistor M5, and the gate terminal is connected to the positive input voltage terminal VINP. The source terminal of the P-type transistor M2 is connected to the drain terminal of the P-type transistor M6, and the gate terminal is connected to the negative input voltage terminal VINM.

The resistor R1 is connected between the drain terminal of the P-type transistor M1 and the drain terminal of the P-type transistor M2. The gate terminal of the N-type transistor M3 is connected to the source terminal of the P-type transistor M1 and the drain terminal of the transistor M5, and the drain terminal supplies a negative output voltage (VOUTM). The gate terminal of the N-type transistor M4 is connected to the source terminal of the P-type transistor M2 and the drain terminal of the P-type transistor M6, and the source terminal supplies a positive output voltage (VOUTP).

The resistor R2 is connected between the drain terminal of the N-type transistor M3 and the drain terminal of the N-type transistor M4, and the middle point is connected to the reference voltage terminal VCM. The drain terminal of the N-type transistor M9 is connected to the drain terminal of the P-type transistor M1, the source terminal of the N-type transistor M3, and one end of the resistor R1, the gate terminal is connected to the bias voltage terminal BIAS2, and the source terminal is connected to the power voltage terminal VSS. The drain terminal of the N-type transistor M10 is connected to the drain terminal of the P-type transistor M2, the source terminal of the N-type transistor M4, and the other end of the resistor R1, the gate terminal is connected to the bias voltage terminal BIAS2, and the source terminal is connected to the power voltage terminal VSS.

The drain terminal of the P-type transistor M7 is connected to the drain terminal of the N-type transistor M3 and one end of the resistor R2, the gate terminal is connected to the bias voltage terminal BIAS1, and the source terminal is connected to the power voltage terminal VDD. The drain terminal of the P-type transistor M8 is connected to the drain terminal of the N-type transistor M4 and the other end of the resistor R2, the gate terminal is connected to the bias voltage terminal BIAS1, and the source terminal is connected to the power voltage terminal VDD.

The resistor R2 includes a resistor R3 and a resistor R4 which have equal resistance values. The resistor R3 is connected between the drain terminal of the N-type transistor M3 and the reference voltage terminal VCM. The resistor R4 is connected between the drain terminal of the N-type transistor M4 and the reference voltage terminal VCM.

The P-type transistor M5, the P-type transistor M6, the P-type transistor M7, the P-type transistor M8, the N-type transistor M9, and the N-type transistor M10 control the currents flowing through them to be a constant value.

Based on the bias voltage (BIAS1), the P-type transistor M5 controls the bias current supplied to the P-type transistor M1 to be a constant value. Based on the bias voltage (BIAS1), the P-type transistor M6 controls the bias current supplied to the P-type transistor M2 to be a constant value.

Based on the bias voltage (BIAS1), the P-type transistor M7 controls the bias current supplied to the N-type transistor M3 to be a constant value. Based on the bias voltage (BIAS1), the P-type transistor M8 controls the bias current supplied to the N-type transistor M4 to be a constant value.

Based on the bias voltage (BIAS2), the N-type transistor M9 controls the sum of the bias currents supplied to the P-type transistor M1 and the N-type transistor M3 to be a constant value. Based on the bias voltage (BIAS2), the N-type transistor M10 controls the sum of the bias currents supplied to the P-type transistor M2 and the N-type transistor M4 to be a constant value.

The above connection designations are those when the power voltage (VDD) is the positive power and the power voltage (VSS) is the negative power. If the power voltage (VDD) is the negative power and the power voltage (VSS) is the positive power, the polarities of all the transistors are reversed. For sake of simplicity, polarities will not be designated in the explanation below.

The operation of the amplifier circuit 100 will be described. When a positive input voltage (VINP) is input to the gate terminal of the transistor M1 and a negative input voltage (VINM) is supplied to the gate terminal of the transistor M2, a differential voltage (Δvin) of the positive input voltage (VINP) and the negative input voltage (VINM) is generated in the resistor R1. The resistor R1 generates a differential current ($\Delta i = \Delta vin/r1$) corresponding to the differential voltage ($\Delta vin$) and the resistance value (r1) of the resistor R1. This differential current ($\Delta i$) generated by the resistor R1 changes the current (i3) flowing to the transistor M3 and the current (i4) flowing to the transistor M4. If the current (i7) flowing to the transistor M7 and the current (i8) flowing to the transistor M8 are in a steady state of (i=i7=i8), the relationship between the differential current ($\Delta i$) and the current flowing (i3) to the transistor M3 and the current (i4) flowing to the transistor M4 is expressed in equations (15) to (17).

If a positive input voltage (VINP)>a negative input voltage (VINM), then $$i3 = i + \Delta i, \; i4 = i - \Delta i, \; \Delta i \neq 0 \qquad (15)$$

If a positive input voltage (VINP)<a negative input voltage (VINM), then $$i3 = i - \Delta i, \; i4 = i + \Delta i, \; \Delta i \neq 0 \qquad (16)$$

If a positive input voltage (VINP)=a negative input voltage (VINM), then $$i3 = i, \; i4 = i, \; \Delta i = 0 \qquad (17)$$

Since the current (i5) flowing to the transistor M5 and the current (i6) flowing to the transistor M6 are controlled by the bias voltage (BIAS1), the current (i7) flowing to the transistor M7 and the current (i8) flowing to the transistor M8 are controlled by the bias voltage (BIAS1), and the current (i9) flowing to the transistor M9 and the current (i10) flowing to the transistor M10 are controlled by the bias voltage (BIAS2), these currents are not affected by the value of the differential voltage ($\Delta vin$). Therefore, the current generated in the resistor R2 is the same as the current ($\Delta i$) generated in the resistor R1. The relationship between the differential voltage ($\Delta vout$) of the positive output voltage (VOUTP) and the negative output voltage (VOUTM) and the differential voltage ($\Delta vin$) of the positive input voltage (VINP) and the negative input voltage (VINM) is expressed using the resistance value (r1) of the resistor R1, the resistance value (r2) of resistor R2, the resistance value (r3) of resistor R3, and the resistance value (r4) of resistor R4 in equations (18) and (19).

If a positive input voltage (VINP)>a negative input voltage (VINM), then $$\begin{aligned} voutp &= vcm + \Delta i \times r4 \\ &= vcm + \frac{r4}{r1}\Delta vin \\ &= vcm + \frac{r2}{2 \times r1}\Delta vin \end{aligned} \qquad (18)$$

$$\begin{aligned} voutm &= vcm - \Delta i \times r3 \\ &= vcm - \frac{r3}{r1}\Delta vin \\ &= vcm - \frac{r2}{2 \times r1}\Delta vin \end{aligned}$$

$$\begin{aligned} \Delta vout &= voutp - voutm \\ &= vcm + \frac{r2}{2 \times r1}\Delta vin - vcm + \frac{r2}{2 \times r1}\Delta vin \\ &= \frac{r2}{r1}\Delta vin \end{aligned}$$

If a positive input voltage (VINP)<a negative input voltage (VINM), then $$\begin{aligned} voutp &= vcm - \Delta i \times r4 \\ &= vcm - \frac{r4}{r1}\Delta vin \\ &= vcm - \frac{r2}{2 \times r1}\Delta vin \end{aligned} \qquad (19)$$

$$\begin{aligned} voutm &= vcm + \Delta i \times r3 \\ &= vcm + \frac{r3}{r1}\Delta vin \\ &= vcm + \frac{r2}{2 \times r1}\Delta vin \end{aligned}$$

$$\begin{aligned} \Delta vout &= voutp - voutm \\ &= vcm - \frac{r2}{2 \times r1}\Delta vin - vcm - \frac{r2}{2 \times r1}\Delta vin \\ &= -\frac{r2}{r1}\Delta vin \end{aligned}$$

The amplifier circuit 200 amplifies the differential voltage ($\Delta vin$) of the positive input voltage (VINP) and the negative input voltage (VINM) corresponding to the ratio of the resistor R1 to the resistor R2 constituted by the resistor R3 and the resistor R4. The amplification precision can be increased by giving the resistor R1 the same type of configuration as the resistor R2 constituted by the resistor R3 and the resistor R4.

The drain-source voltage (vds1) of the transistor M1 will be described. If (vds1) is the drain-source voltage of the transistor M1, (vs1) is the source voltage of the transistor M1, (vd1) is the drain voltage of the transistor M1, (vgs1) is the gate-source voltage of the transistor M1, and (vgs3) is the gate-source voltage of the transistor M3, the drain-source voltage (vds1) of the transistor M1 is expressed by equation (20).

$$vds1 = vs1 - vd1 = vinp + vgs1 - (vinp + vgs1 - vgs3) = vgs3 \qquad (20)$$

Therefore, regardless of the value of the positive input voltage (VINP), the drain-source voltage (vds1) of the transistor M1 is fixed at the value of the gate-source voltage (vgs3) of the transistor M3.

The drain-source voltage (vds2) of the transistor M2 will be described. If (vds2) is the drain-source voltage of the transistor M2, (vs2) is the source voltage of the transistor M2, (vd2) is the drain voltage of the transistor M2, (vgs2) is the gate-source voltage of the transistor M2, and (vgs4) is the gate-source voltage of the transistor M4, the drain-source voltage (vds2) of the transistor M2 is expressed by equation (21).

$$vds2 = vs2 - vd2 = vinm + vgs2 - (vinm + vgs2 - vgs4) = vgs4 \qquad (21)$$

Therefore, regardless of the value of the negative input voltage (VINM), the drain-source voltage (vds2) of the transistor M2 is fixed at the value of the gate-source voltage (vgs4) of the transistor M4.

Regardless of the value of the positive input voltage (VINP) and the negative input voltage (VINM), the drain-source voltage (vds1) of the transistor M1 and the drain-source voltage (vds2) of the transistor M2 can be maintained at constant values. This reduces the offset voltage in the transistors M1 and M2, and improves the common-mode rejection ratio of the amplifier circuit 200.

As described above, according to the circuit configuration of the second preferred embodiment of the present invention, in comparison with the circuit shown in non-patent literature 1, the common-mode rejection ratio can be improved with a smaller circuit and less power consumption.

While preferred embodiments of the present invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the claims.

What is claimed is:

1. An amplifier circuit comprising:
   an input differential pair that includes a first transistor and a second transistor, a positive input voltage being supplied to a gate terminal of the first transistor, a negative input voltage being supplied to a gate terminal of the second transistor;
   a first resistor that generates a differential current corresponding to a differential voltage between the positive input voltage and the negative input voltage;
   an output differential pair that includes a third transistor and a fourth transistor, a negative output voltage being supplied from a drain terminal of the third transistor, a positive output voltage being supplied from a drain terminal of the fourth transistor;
   a second resistor that is connected to a reference voltage, the differential current generated by the first resistor being supplied to the second resistor; and
   a bias circuit that supplies a constant bias current to the first, second, third, and fourth transistors; and wherein
   a source terminal of the first transistor is connected to a gate terminal of the third transistor, a source terminal of the second transistor is connected to a gate terminal of the fourth transistor, a drain terminal of the first transistor is connected to a source terminal of the third transistor, a drain terminal of the second transistor is connected to a source terminal of the fourth transistor, and the input differential pair and the output differential pair include transistors having reversed polarities.

2. The amplifier circuit according to claim 1, wherein the first resistor is connected between a source terminal of the first transistor and a source terminal of the second transistor, and the second resistor is connected between a drain terminal of the third transistor and a drain terminal of the fourth transistor.

3. The amplifier circuit according to claim 1, wherein the first resistor is connected between a drain terminal of the first transistor and a drain terminal of the second transistor, and the second resistor is connected between a drain terminal of the third transistor and a drain terminal of the fourth transistor.

4. The amplifier circuit according to claim 1, wherein the bias circuit comprises:
   a fifth transistor that supplies a constant bias current to the first transistor;
   a sixth transistor that supplies a constant bias current to the second transistor;
   a seventh transistor that supplies a constant bias current to the third transistor;
   an eighth transistor that supplies a constant bias current to the fourth transistor;
   a ninth transistor that controls sum of currents supplied to the first transistor and the third transistor to be a constant value; and
   a tenth transistor that controls sum of currents supplied to the second transistor and the fourth transistor to be a constant value.

5. The amplifier according to claim 1, wherein the second resistor comprises a third resistor and a fourth resistor having same resistance values, and the first resistor, the third resistor, and the fourth resistor are of a same type.

* * * * *